(12) United States Patent
Zhou

(10) Patent No.: US 12,190,970 B2
(45) Date of Patent: Jan. 7, 2025

(54) MEDIA MANAGEMENT

(71) Applicant: Micron Technology, Inc., Boise, ID (US)

(72) Inventor: Donghua Zhou, Suzhou (CN)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 17/824,384

(22) Filed: May 25, 2022

(65) Prior Publication Data
US 2023/0386588 A1 Nov. 30, 2023

(51) Int. Cl.
*G11C 16/34* (2006.01)
*G06F 3/06* (2006.01)
*G06F 11/30* (2006.01)

(52) U.S. Cl.
CPC .......... *G11C 16/349* (2013.01); *G06F 3/0614* (2013.01); *G06F 3/064* (2013.01); *G06F 3/0653* (2013.01); *G06F 11/3037* (2013.01)

(58) Field of Classification Search
CPC ..... G11C 16/349; G06F 3/0614; G06F 3/064; G06F 3/0653; G06F 11/3037
See application file for complete search history.

(56) References Cited

U.S. PATENT DOCUMENTS

| | | |
|---|---|---|
| 8,812,454 B2 | 8/2014 | Naga et al. |
| 9,135,160 B1 | 9/2015 | Zheng et al. |
| 10,169,420 B2 | 1/2019 | Kaijima et al. |
| 2016/0103630 A1* | 4/2016 | Shen ..................... G06F 11/008 714/37 |
| 2018/0260137 A1* | 9/2018 | Tsou ..................... G06F 3/0659 |
| 2019/0067300 A1* | 2/2019 | Chiu ................ G11C 29/12005 |
| 2019/0205245 A1* | 7/2019 | Gao ....................... G11C 16/16 |
| 2022/0300184 A1* | 9/2022 | Yang ..................... G06F 3/0616 |

* cited by examiner

*Primary Examiner* — Charles Rones
*Assistant Examiner* — Jonah C Krieger
(74) *Attorney, Agent, or Firm* — Brooks, Cameron & Huebsch, PLLC

(57) ABSTRACT

A method includes determining a gap between a difference in a first health characteristic value and a second health characteristic value of blocks of memory cells and a health threshold associated with the blocks of memory cells, determining the gap is greater than or equal to a gap threshold from the health threshold, performing a pseudo media management operation on the blocks of memory cells, and determining an updated first health characteristic value of the blocks of memory cells.

18 Claims, 6 Drawing Sheets

MEDIA MANAGEMENT

TECHNICAL FIELD

Embodiments of the disclosure relate generally to memory sub-systems, and more specifically, relate to media management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
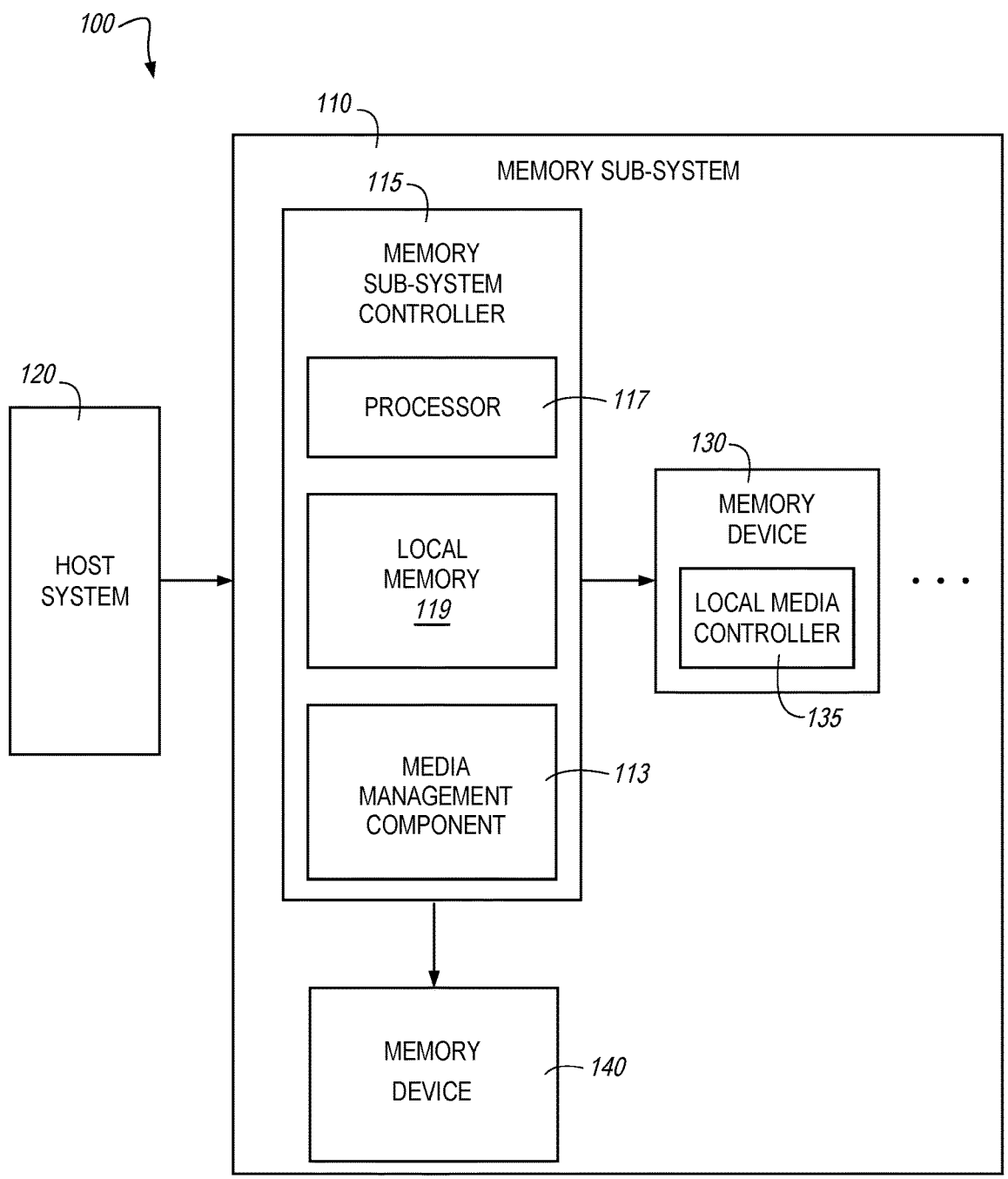
FIG. 1 illustrates an example computing system that includes a memory sub-system in accordance with some embodiments of the present disclosure.

Aspects of the present disclosure are directed to media management, in particular to memory sub-systems that include a media management component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Due to characteristics inherent in NAND memory devices, data quality can degrade over time. Health characteristics, as detailed herein, can indicate a degree of wear of a block of memory cells. For instance, a health characteristic can be a program-erase cycle (PEC) count of a block of memory cells, among other possible health characteristics. As used herein, a "EC" generally refers to the number of times a NAND block has been accessed (e.g., programmed and/or erased), which is a health characteristic value. As the EC of a block increases, data quality in the block can decrease. In some instances, the EC can be a EC of a physical block of memory cells. As used herein, a "physical block of memory cells" or "physical block" generally refers to a set of memory cells that store charges corresponding to data values and has an address (e.g., a physical block address) associated therewith.

Degradation of data quality can render blocks prone to failures such as causing a read operation performed on a memory cell in the block to fail or return a corrupted/incorrect data value. As such, some approaches perform media management operations on blocks. Non-limiting examples of media management operations can include error correction operations, wear leveling operations, read disturb mitigation operations, and/or garbage collection operations.

A "garbage collection operation" generally refers to a process of folding data from a victim block stripe into a new destination block stripe, with the intended purpose of data consolidation to free up memory resources for subsequent program/erase cycles. "Folding" data refers to the internal migration of data from one NAND location to another NAND location independent of any direct host interaction. Folding can be performed to pack valid data together (garbage collection), freeing more space for new writes, for error avoidance, for wear leveling, and to restore RAIN parity protection in the event of an error. As used herein, a "block stripe" generally refers to a logical grouping of blocks that share a same upper block number and can be accessed in parallel. Garbage collection operations can include reclaiming (e.g., erasing and making available for programming) memory blocks that have the most invalid pages among blocks in the memory device(s). In some embodiments, garbage collection can include reclaiming memory blocks with more than a threshold amount (e.g., quantity) of invalid pages. However, if sufficient free memory blocks exist for a programming operation, then a garbage collection operation may not occur.

A "wear leveling operation" generally refers to an operation performed on one or more blocks to control the wear rate of such blocks. Wear leveling operations can regulate the number of process cycles (e.g., program and/or erase cycles) performed on a particular group of blocks by spreading such cycles more evenly over an entire memory array and/or memory device. Examples of wear leveling operations include static wear leveling operations and dynamic wear leveling operations.

A "dynamic wear leveling operation" generally refers to the process of block stripe selection for erases and new writes by EC. However, dynamic wear leveling approaches do not typically attempt to account for or attempt to reduce a frequency of occurrence of static wear leveling operations, which as detailed herein, can degrade performance of a memory array during a static wear leveling operation.

A "static wear leveling operation" generally refers to a process of collecting and folding long resident drive data into a block stripe that has higher wear than others in the system. Static wear leveling can be predicated at least in part on determination of a health characteristic value such as a minimum EC and/or a maximum EC. For instance, static wear leveling can be performed to reduce a gap between a minimum EC and a maximum EC. Yet, such determination of a minimum EC can be computationally expensive, and thus can degrade performance of a memory sub-system. For instance, determination of a minimum EC can rely on a time-consuming and/or computationally expensive process of obtaining information representative of respective EC of each memory blocks in a plurality of memory blocks, and thus a memory sub-system can experience degraded performance. Degradation of performance can be undesirable, especially in critical applications and/or in demanding applications in which very high memory sub-system performance is expected. Further, this degraded performance that can be exhibited in such approaches can be further exacerbated in mobile (e.g., smartphone, internet of things, etc.) memory deployments in which an amount of space available to house a memory sub-system is limited in comparison to traditional computing architectures.

Aspects of the present disclosure address the above and other deficiencies by performing media management. For instance, pseudo media management operations (e.g., pseudo static wear-leveling operations) can be selectively performed responsive to memory operations (e.g., erase operations) in the absence of performance of a media management operation (e.g., a static wear-leveling operation). In contrast to the media management operations that include and/or are predicated on determination of an actual minimum health characteristic value (e.g., a MIN EC), the pseudo media management operations can be performed in the absence of determination of an actual minimum health characteristic value, as detailed herein). Accordingly, performing pseudo media management operation can reduce computational overhead and any associated performance decrease, as compared to other approaches that determine the actual health characteristic values responsive to each memory operation (e.g., responsive to each erase operation).

For instance, embodiments herein contemplate that a gap between a difference in a first health characteristic value and a second health characteristic value of blocks of memory cells and a health threshold can be determined. Further, embodiments herein contemplate that responsive to a determination that the gap is less than a health threshold and/or is greater than or equal to a gap threshold from the health threshold, at least one pseudo media management operation can be performed, and an updated first health characteristic value (i.e., an actual first health characteristic value) of the blocks of memory cells can be determined subsequent to performance of the at least one pseudo media management operations. Determining the updated first health characteristic value subsequent to performance of the at least one pseudo media management operation can reduce a total quantity of times the updated first health characteristic value is determined as compared to other approaches that determine an updated health characteristic responsive to each occurrence of a memory operation (e.g., each occurrence of an erase operation). Thus, approaches herein can reduce computational overhead any resultant decrease performance that would otherwise result from more frequently determining the updated (i.e., actual) health characteristic values, as detailed herein.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

As described above, the memory components can be memory dice or memory packages that form at least a portion of the memory device 130. In some embodiments, the blocks of memory cells can form one or more "superblocks." As used herein, a "superblock" generally refers to a set of data blocks that span multiple memory dice and are written in an interleaved fashion. For instance, in some embodiments each of a number of interleaved NAND blocks can be deployed across multiple memory dice that have multiple planes and/or pages associated therewith. The terms "superblock," "block," "block of memory cells," and/or "interleaved NAND blocks," as well as variants thereof, can, given the context of the disclosure, be used interchangeably.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

The memory sub-system 110 can include a media management component 113. Although not shown in FIG. 1 so as to not obfuscate the drawings, the media management component 113 can include various circuitry to facilitate aspects of media management, as detailed herein. In some embodiments, the media management component 113 can include special purpose circuitry in the form of an ASIC, FPGA, state machine, and/or other logic circuitry that can allow the media management component 113 to orchestrate and/or perform the operations described herein.

In some embodiments, the memory sub-system controller 115 includes at least a portion of the media management component 113. For example, the memory sub-system controller 115 can include a processor 117 (processing device) configured to execute instructions stored in local memory 119 for performing the operations described herein. In some embodiments, the media management component 113 is part of the memory sub-system 110, an application, or an operating system.

In a non-limiting example, an apparatus (e.g., the computing system 100) can include a media management component 113. The media management component 113 can be resident on the memory sub-system 110. As used herein, the term "resident on" refers to something that is physically located on a particular component. For example, the media management component 113 being "resident on" the memory sub-system 110 refers to a condition in which the hardware circuitry that comprises the media management component 113 is physically located on the memory sub-system 110. The term "resident on" can be used interchangeably with other terms such as "deployed on" or "located on," herein.

The media management component 113 can be configured to determine a health characteristic value (e.g., a EC) of a block of memory cells. As used herein, "health characteristics" generally refer to quantifiable attributes of memory cells in a block that correspond to the quality, life expectancy, or other attributes of the memory cells that can affect the ability of the memory cells to accurately store data. Non-limiting examples of health characteristics or health metrics can include a raw bit error rate (RBER) associated with the memory cells, wear leveling characteristics associated with the memory cells, and/or a total quantity of program-erase cycles the memory cells have been subjected to, among others. As such, various scans such as a background scan, a RBER scan, a read scan, and/or an integrity scan can be employed to determine a given heath characteristic value. For instance, determination of the health characteristic value can include determination of at least one of a EC, an erase count, an age, or any combination thereof, of a block. In some embodiments, the health characteristic value such as a EC can be a value that is incremented in a table such as a look-up table or is otherwise stored or accessible to the memory sub-system 110.

For instance, the media management component 113 can be configured to determine a first health characteristic value and a second health characteristic value. In such instances, the media management component 113 can be configured to determine a difference between the first health characteristic value (e.g., a minimum EC) and a second health characteristic value (e.g., a maximum EC).

The media management component 113 can be configured to determine a gap between a difference in a first health characteristic value and a second health characteristic value and a health threshold associated with the blocks of memory cells. As used herein, a "health threshold" generally refers to a particular total number of health characteristic values. For instance, the health threshold can refer to a total number of program-erase cycles. In some embodiments, the health threshold can be equal to 500, 1000, 1500, 2000, 3000, 4000, or 5000 program-erase cycles, among other possible types of health thresholds/values. In some embodiments, the health threshold can be a value that is stored in a table such as a look-up table or is otherwise stored or accessible to the memory sub-system. In any case, the media management component 113 can be configured to compare a health characteristic value to a health threshold and thereby determine a gap or difference between the health characteristic value and the health threshold. In various embodiments, a value of a difference (e.g., 10 EC) between a first health characteristic value (e.g., a EC of 0) of a first block and a second health characteristic value (e.g., a EC of 10) of a second block of memory cells can be compared to a health threshold (e.g., a static wear-leveling threshold of 20), as detailed herein.

The media management component 113 can be further configured to perform a quantity of pseudo media management operations. For instance, a quantity of pseudo media management operations can be performed responsive to a determination that a gap between a difference in a first health characteristic value and a second health characteristic value is greater than or equal to a gap threshold (e.g., 1 EC) from (less than) the health threshold, as detailed herein.

As used herein, a "pseudo media management operation" refers to an operation that increments a health characteristic value in absence of performance of a media management operation (e.g., a static wear leveling operation). For instance, a pseudo media management operation can be performed responsive to an erase operation in the absence of performance of an actual media management operation. In this way, a quantity and frequency of media management operations and associated computation overhead can be reduced, as compared to approaches that perform a media management operation (e.g., determine a minimum EC) responsive to each occurrence of a memory operation such as an erase operation. For instance, performance of media management operation can be avoided until an incremented health characteristic value is incremented to a degree that results in a gap between a first health characteristic value and the incremented second health characteristic value is no longer a "safe" distance from a health threshold. However, for memory operations that occur when the gap is a "safe" distance from the health threshold, a pseudo media management operation can be performed. In this manner, performance of media management operation can be delayed until the gap is no longer a "safe" distance from the health threshold.

That is, the media management component 113 can be further configured to increment a health characteristic value to an incremented health characteristic value. For instance, the media management component 113 can increment the second health characteristic value be a quantity that is equal to a quantity of the at least one pseudo media management operations and/or by a quantity that is equal to a quantity of memory operations (e.g., erase operations) since determination of the health characteristic value. Such incrementing of the second health characteristic can provide a reliable and known rate of increase in the second health characteristic value and yet can be done in an absence of incurring the computational overhead typically associated with determination of an actual health characteristic value (e.g., a minimum EC) that would typically be performed to responsive to occurrence of each memory operation (e.g., responsive to each erase operation).

The media management component 113 can be further configured to selectively perform a media management operation on a block. For instance, in some embodiments the media management component 113 can select a particular block of memory cells for a media management operation (e.g., a static wear leveling operation and/or garbage collection operation, among other media management operations) subsequent to performing at least one pseudo media management operation. In this way, the updated first health characteristic value can be determined subsequent to performing at least one pseudo media management operation. In some embodiments, the media management component 113 can perform a static wear leveling operation subsequent to performing at least one pseudo media management operation.

Figure 2A:
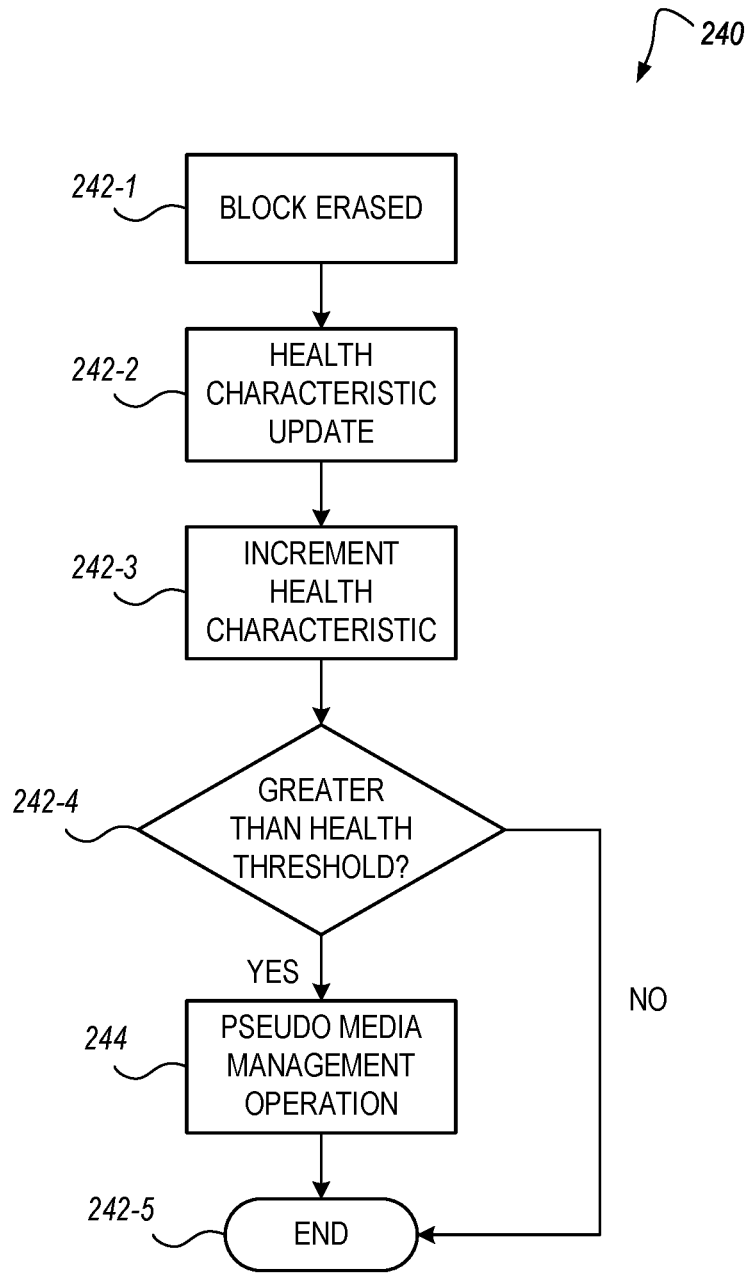
FIG. 2A illustrates an example diagram for media management in accordance with some embodiments of the present disclosure.
Figure 2B:
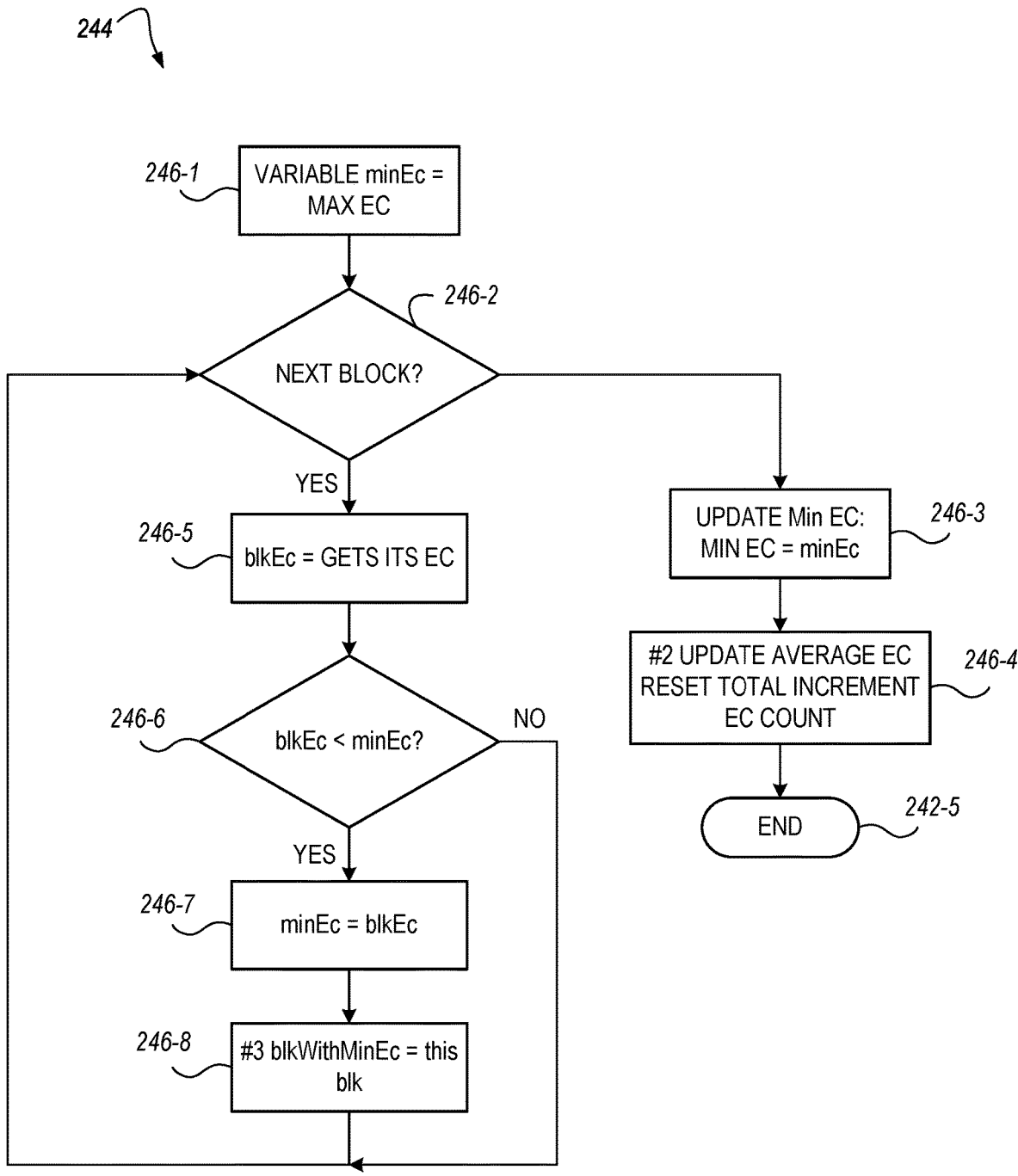
FIG. 2B illustrates another example diagram for media management in accordance with some embodiments of the present disclosure.

FIG. 2A illustrates an example diagram 240 for media management in accordance with some embodiments of the present disclosure. FIG. 2B illustrates another example diagram 244 for media management in accordance with some embodiments of the present disclosure. The diagrams 240 and 244 of FIG. 2A and FIG. 2B, respectively, illustrate aspects of performing media management for a memory sub-system having blocks of memory cells such as the memory sub-system 110. As mentioned, the memory sub-system 110 can include media, such as one or more volatile memory devices (e.g., memory device 140), one or more non-volatile memory devices (e.g., memory device 130), or a combination of such.

As mentioned, a block of memory cells can have a respective health characteristic value. For instance, the health characteristic value can be a given EC of a block. As mentioned, it can be desirable to normalize or reduce any difference between a given health characteristic value and the health threshold (e.g., an average health characteristic value). Each block of memory cells can have a respective block identifier. The block identifier and a current respective health characteristic value of the block can be stored in a lookup table or other data structure.

At 242-1, an memory operation can be performed on a block of memory cells. For instance, an erase operation can be performed on the block of memory cells.

A respective health characteristic value of a block of memory cells can be set responsive to performance of the memory operation at 242-1. For example, a current EC of a block (i.e., a curBlkEc) with a given block ID that is stored in a look up table or other data structure can be incremented by a value of 1 or another value responsive to an erase operation being performed on the block, at 242-1.

At 242-2, an initial health characteristic such as a maximum EC (MAX EC) can be updated. As used herein, the MAX EC refers to a global maximum erase count that is representative of an erase count of a particular block that has the highest EC of a plurality of respective EC of a plurality of blocks. Similarly, as used herein a MIN EC refers to a global minimum erase count that is representative of an erase count of a particular block that has the lowest EC of a plurality of respective EC of a plurality of blocks.

For instance, the respective EC of the plurality of blocks can be determined and compared to the MAX EC responsive to performance of the memory operation, at 242-1. Responsive to a determination that a respective EC (curBlkEc) of the plurality of blocks is greater than the current value of the MAX EC can be updated to the value of the respective EC. Stated differently, if (curBlkEc>MAX EC) then a value of the MAX EC can be updated to the value of the erase count of the curBlkEc. Conversely, if (curBlkEc<or equal to MAX EC) then value of the MAX EC can remain unchanged.

At 242-3, a difference between a first health characteristic value and a second health characteristic value of blocks of memory cells can be determined. For instance, an absolute value of a difference between the first health characteristic value and the second health characteristic value can be determined. The first health characteristic value can be a minimum health characteristic value (e.g., MIN EC) and the second health characteristic value can be a maximum health characteristic value (MAX EC). The first health characteristic value (e.g., MIN EC), the second health characteristic value (e.g., MAX EC) can be stored in a lookup table or other data structure.

At 242-4, a gap between i) the difference in the first health characteristic value and the second health characteristic value, and ii) a health threshold, can be determined. For instance, an absolute value of a difference between i) and ii) can be determined.

The gap can be compared to a heath threshold such as a wear-leveling threshold. The health threshold can be a value stored in a look-up table or other data structure. The health threshold can be equal to or greater than a gap threshold. That is, in various instances the gap can be compared to a gap threshold that is less than the health threshold. In some embodiments, the gap threshold can be equal to at least one health characteristic value. In some embodiments, the gap threshold can be equal to at least one erase operation. For instance, the gap threshold (e.g., a gap threshold of 1 EC from the health characteristic threshold) can be at least one health characteristic value less than a health threshold (e.g., 20 EC). Thus, in various embodiments, the gap threshold can be provide a buffer that is at least one erase operation less than a quantity of erase operations of the health threshold.

Responsive to a determination that the gap is less than a gap threshold from the health threshold and/or that the gap is exceeds the health threshold, the flow can proceed to 242-5. At 242-5, a health characteristic value can be determined and, in some instances, a media management operation such as a wear-leveling operation can be performed. For instance, a MIN EC can be determined at 242-5. That is, in contrast to other approaches that incur the computation overhead associated with updating the MIN EC each time block of memory cells is erased, approaches herein determine the MIN EC less frequently (e.g., only when the gap is greater than the health threshold), and thereby inherently have less computational overhead and thus provide enhanced performance. Moreover, in contrast to other approaches that update a MIN EC responsive to performing an erase operation on block having a current minimum health characteristic value, approaches herein provide a reliable and predictable interval determination of the MIN EC that is unrelated to which block of memory cells undergoes a given memory operation, and thereby approaches herein inherently have less computational overhead and provide enhanced performance.

Responsive to a determination that the gap is less than a health threshold and/or is greater than or equal to the gap threshold from the health threshold (e.g., that the gap is less than a health threshold), the flow can proceed to 244. At 244, at least one pseudo media management operations can be performed.

As illustrated in FIG. 2B an example pseudo media management operation represented by the flow 244 can be performed. As mentioned, performance of the pseudo media management operation represented by the flow 244 can be performed responsive to a determination, at 242-4 in FIG. 2A, that the gap is less than the health threshold and/or is greater than or equal to the gap threshold from the health threshold. Performance of the at least one pseudo media management operation can include setting a value of a counter or otherwise denoting a quantity of erase operations that have occurred since determination of a health characteristic value such as determination of a MIN EC.

At 246-1, a current minimum (MIN EC) can be determined and/or an initial variable health characteristic value such as a variable minimum EC (i.e., minEC) can be set. The minEC can refer to a local variable used to record the minimum EC during traversing the blocks of memory cells. For instance, the minEC can be found and stored as the local variable minEC.

A minEC can be set to a given value such as a current maximum EC (i.e., MAX EC), as determined at 242-2 in FIG. 2A. That is, for purposes of performing a pseudo wear leveling operation a variable health characteristic value such as a minEC can be set to a given current maximum EC (i.e., MAX EC) and/or a given current MIN EC. The variable health characteristic value can be stored in a look-up table or other data structure.

At 246-2, a determination is made whether to proceed to a next block. The determination can be based on whether there is a block having a next valid block ID in a look-up table or other data structure. That is the blocks can be included in a list or otherwise organized such that the blocks can be traversed one by one. In this way, each block of a plurality of blocks can be checked to determine a respective EC of each block of the plurality of blocks.

For instance, responsive to a determination that there is a next valid block ID (YES), the flow can proceed to 246-3. At 246-3, the health characteristic value of a block can be determined. For instance, a respective erase count (blkEC) of the block can be determined.

At 246-4, the health characteristic value of the block can be compared to a minimum health characteristic threshold such as the minEc. Responsive to a determination that the health characteristic value of the block is greater than (or equal to) the minimum health characteristic value (e.g., the minEC) the flow can return to 246-2.

Responsive to a determination that the health characteristic value of the block is less than the minimum health characteristic value (e.g., minEc) the flow can proceed to 246-5. At 246-5, the minEC can be updated to be equal to the health characteristic value of the block such as the blkEC and the flow can proceed to 246-6. At 246-6, an entry in a look-up table or other data structure can be updated to the block ID of the block having the MIN EC. In some embodiments, the block having the MIN EC can be selected as a source block for a wear leveling operation.

Responsive to a determination that there is a not a next valid block ID, the flow can proceed to 246-7. Thus, all blocks have been checked to determine a minEC. At 246-7, the MIN EC can be updated to be equal to the minEC. That is, the health characteristic value can be an EC, among other possible types of health characteristic values.

Responsive to updating the MIN EC, the flow can proceed to 246-8. At 246-8 an average health characteristic value can be updated. In some embodiments, the average health characteristic value can be determined using Equation 1, among other possibilities.

$$\text{Updated average } EC = \frac{\text{Average } EC * \text{Block Count} + InCrEcCount}{\text{Block Count}} \quad \text{(Equation 1)}$$

Where the updated average EC is equal to a previous average EC*(the sum the block count and a value of the incremented erase counter) divided by the sum of the block count (e.g., a total # of blocks in the memory-subsystem). Responsive to determining the updated average health characteristic value, the flow can end at 242-5. In some instance, responsive to ending of the flow at 242-5, a wear-leveling operation such as a static wear-leveling operation can performed.

Figure 3:
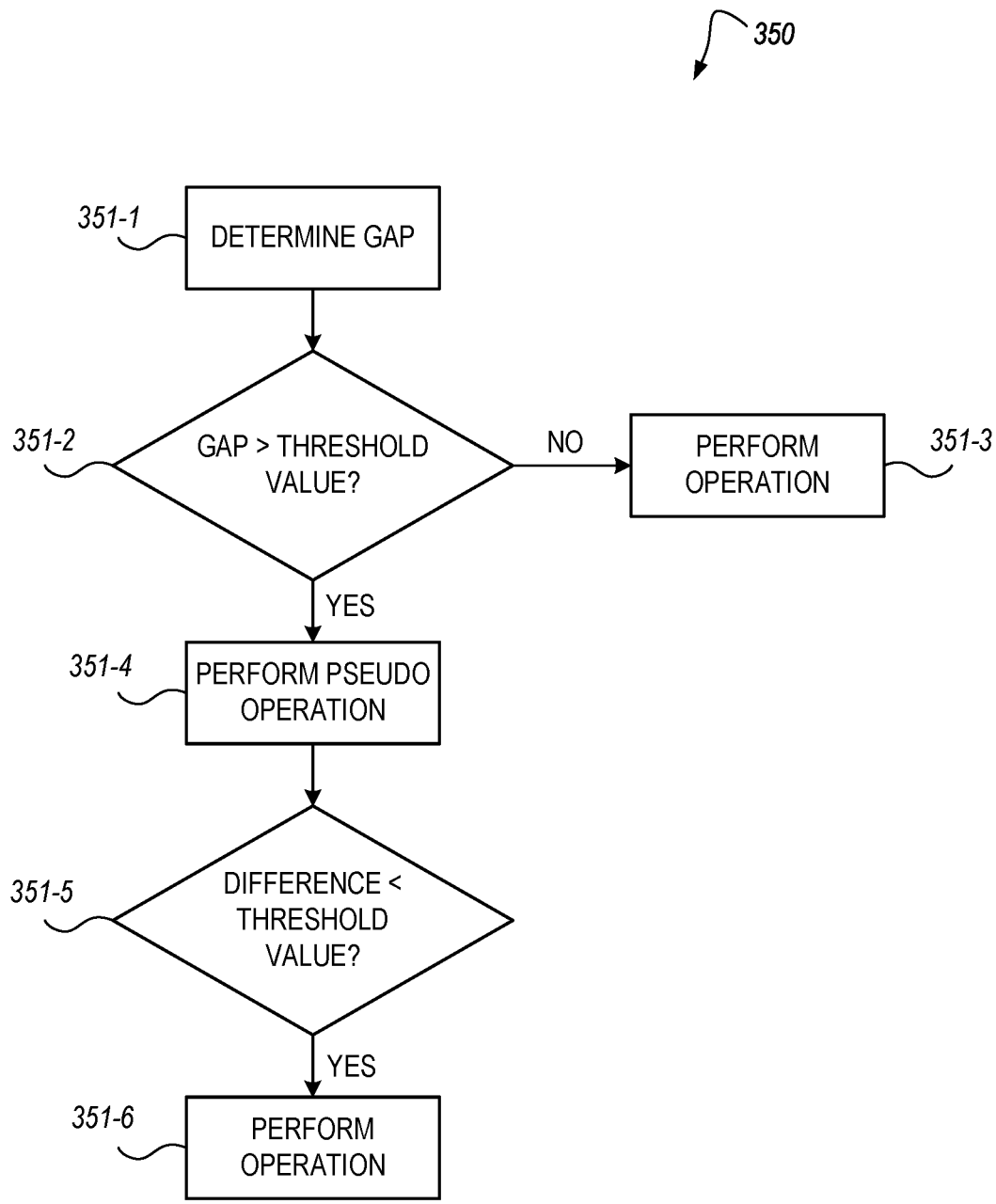
FIG. 3 illustrates another example diagram for media management in accordance with some embodiments of the present disclosure.

FIG. 3 illustrates another example diagram 350 for media management in accordance with some embodiments of the present disclosure. At 351-1, a gap between a difference between a first health characteristic value and a second health characteristic value and a health threshold can be determined. For example, a difference (e.g., 10 EC) between a first health characteristic value (e.g., a MIN EC equal to 0) and the second health characteristic value (e.g., a MAX EC equal to 10) can be determined. The difference (e.g., 10 EC) can be compared to a heath threshold (e.g., 20 EC) to determine a gap (e.g., 10 EC) between difference and the health threshold.

At 351-2, the gap can be compared to health threshold and/or can be compared to a gap threshold that is less than the health threshold. For instance, the gap (e.g., 10 EC) can be compared to a health threshold (e.g., 20 EC). In such instances, the gap can be determined to be less than the health threshold and/or greater than a gap threshold (e.g., 1 EC) from the health threshold. That is, in some embodiments, the gap threshold can be at least one health characteristic value less a value of the health threshold. Having the gap threshold be at least one health characteristic value less than the health threshold can permit readily determining whether the health characteristic value of any blocks is at least a sufficiently "safe" distance from potentially reaching the health threshold. For instance, in the above example with a gap threshold of 1 EC and the health threshold of 20 EC the gap is deemed to be a "safe" distance from the health threshold when a value of the gap is equal to 19 EC or less. Thus, at least one additional memory operation (e.g., an erase operation) can be performed without the possibility of exceeding the health threshold (e.g., a gap of 20 EC). However, in various embodiments, a gap threshold can be omitted and/or the value of the gap threshold can be equal to a value of the health threshold and thus permit readily comparing the gap to the health threshold.

Responsive to a determination that the gap exceeds the health threshold and/or is less than or equal to the gap threshold from the health threshold, the flow can proceed to 351-3. That is, a sufficient quantity of memory operations (e.g., erase operations) have occurred such that a block of memory cells can potentially have a health characteristic value that the health threshold is exceeded and/or that the gap is no longer a "safe" distance from the health threshold. Accordingly, at 351-3, as actual or global) health characteristic value can be determined. For instance, a MIN EC can be determined. In some instance, a wear leveling operation such as static wear leveling can be performed responsive to determination of the MIN EC.

Responsive to a determination that the gap is less than the health threshold and/or greater than the gap threshold from the health threshold, the flow can proceed to 351-4. At 351-4, a quantity of pseudo media management operation can be performed, as detailed herein. Performance of the pseudo media management operation can set or increment a health characteristic value to an incremented health characteristic value. The incremented health characteristic value can be determined instead of determination of updated (actual or global) health characteristic value. Thus, performance of the pseudo media management can occur of the absence of determination of an actual or global health characteristic value (e.g., MIN EC), and thus can avoid incurring the computational overhead, etc. associated with determination of the actual or global health characteristic value.

For instance, a quantity of memory operations (e.g., erase operations) since an initial memory operation associated with determination of an initial (e.g., actual health characteristic value) can be tracked. The quantity of memory operations can be tracked by incrementing a counter or otherwise. In such instances, the health characteristic value can be incremented by a quantity that is equal to the quantity of memory operations. For example, as mentioned as minimum EC can be 10 EC and the maximum EC can be 20 EC. As such a gap between the minimum EC and the maximum EC can 10 EC. The gap can be compared to a health threshold (e.g., 20 EC). The gap (e.g., 10 EC) can be determined to less than the health threshold. In such instances, at least 10 EC (e.g., corresponding to memory operations associated with a block of memory cells having the highest EC) are necessary to increase the gap to be equal to the health threshold. That is, in at least theoretically the occurrence of 10 memory operations could result in the gap increasing to a value of 20 EC and thus being equal to a the health threshold.

Accordingly, in some embodiments, the first health characteristic value, the second health characteristic value, or both, can be incremented by the amount equal to a quantity of memory operations. For instance, in various embodiments a second health characteristic value which is a maximum EC of the blocks of non-volatile memory cells can be incremented by the quantity of pseudo media management operations to an incremented maximum EC. In such embodiments, an updated difference (updated subsequent to performing the pseudo media management operation) between a minimum EC (which was previously determined at a first time) and the incremented maximum EC (which is determined at a second time that is subsequent to the first time) can be determined. Thus, an updated gap (e.g., 19 EC) between the first health characteristic value (e.g., 0 EC) and an incremented second health characteristic value (e.g., 19 EC) can be determined.

Following performance of a pseudo media management operation, the flow can proceed to 351-5. At 351-5, the updated gap can be compared to a heath threshold and/or a gap threshold.

Responsive to determining the updated gap is less than the health threshold and/or greater than the gap threshold from the health threshold, the flow can return to 351-4. That is, in various embodiments, a quantity of pseudo media management operations can be performed (e.g., to increment a health characteristic value such as a second health characteristic value) until it is determined that the updated gap is equal to or exceeds the health threshold and/or is less than the gap threshold from the health threshold.

Responsive to a determination that the updated gap is equal to or exceeds the health threshold and/or is less than the gap threshold from the health threshold, the flow can proceed to 351-6. At 351-6, an actual or global health characteristic value can be determined. For instance, a MIN EC can be determined.

In some embodiments, a wear-leveling operation can be performed responsive to determination of the MIN EC. For instance, a static wear leveling operation can be performed on a block having a highest health characteristic value, and thereby mitigate the difference between the highest and lowest health characteristic values of the blocks. For example, a static wear leveling operation can write data from a source block to a destination block. The destination block can be selected from a free block pool. A block having a given health characteristic value (e.g., a block having the highest health characteristic value) can be selected as the source block. The destination block (e.g., a selected destination block) can have a lower health characteristic value (e.g., a lower EC) than the source block. In some examples, a block having a given health characteristic value (e.g., a lowest health characteristic value) in the free block pool can be selected as the destination block, among other possibilities.

Figure 4:
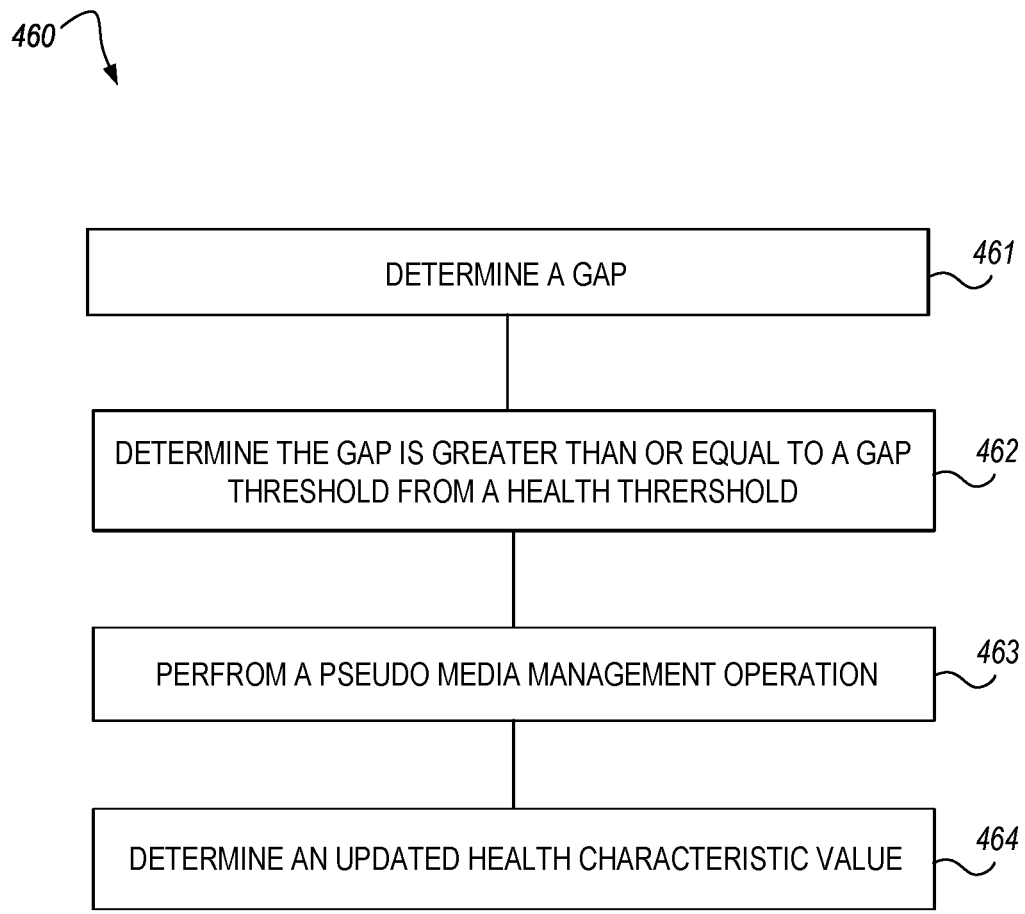
FIG. 4 is a flow diagram corresponding to a method for media management in accordance with some embodiments of the present disclosure.

FIG. 4 is flow diagram corresponding to a method 460 for media management in accordance with some embodiments of the present disclosure. In some embodiments, the method 460 can be employed as a part of or in conjunction with performance of a wear leveling such as a static wear leveling operation. The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 461, a gap between a first health characteristic value and a second health characteristic value be determined. The health characteristic value can be determined for a physical block of memory cells in a memory sub-system including a plurality of physical blocks of memory cells. For instance, a EC or other indicator of block wear can be determined. In some embodiments, the memory sub-system can be analogous to the memory sub-system 110 illustrated in FIG. 1. As described above, the memory components can be memory dice or memory packages that are coupled to one another to create an array of memory cells, such as a three-dimensional stackable cross-gridded array of memory cells used by the memory sub-system to store data. In some embodiments, the first health characteristic value can be minimum EC (e.g., a global minimum EC) and the second health characteristic value can be a maximum EC (e.g., a global maximum EC). The gap can be determined responsive to determining the first health characteristic value and/or the second health characteristic value, among other possibilities.

At 462, the gap can be compared to a health threshold to determine whether the gap is less than a health threshold and/or greater than a gap threshold from the health threshold. For instance, when a gap (e.g., an absolute value of the difference between the first threshold and the second threshold) greater than a health threshold and/or is less than a gap threshold a MIN EC can be determined. For instance, when the gap is equal to or exceeds a health threshold an actual health characteristic value such as a MIN EC can be determined.

Conversely, when a gap between the first threshold and the second threshold is greater than or equal to a gap threshold (e.g., a value of at least one EC less than the health threshold) from the health threshold then the proximity of the gap to the health threshold may be deemed acceptable, and a pseudo media management operation can be performed, as indicated at 463. That is, as long as the a gap between the first threshold and the second threshold is greater than or equal to a gap threshold from the health threshold (e.g., is less than the health threshold) then it is certain that at least one more memory operation (e.g., an erase operation) can occur before any block could have a maximum EC that would result in a large enough gap (between a MAX EC and a MIN EC) to trigger a wear-leveling operation such as static wear-leveling. Notably, the pseudo media management operation can be performed in the absence of occurrence of determination of an actual updated health characteristic value and thereby avoid the computation overhead (e.g., associated with determination of an updated health characteristic value such as an updated MIN EC) and thus avoid any associated decrease in performance.

At 464, an updated health characteristic can be determined. For instance, an updated first health characteristic (e.g., a MIN EC), a updated second health characteristic (e.g., a MAX EC), or both, can be determined. In some embodiments, an updated average health characteristic value can be determined, as detailed herein.

Figure 5:
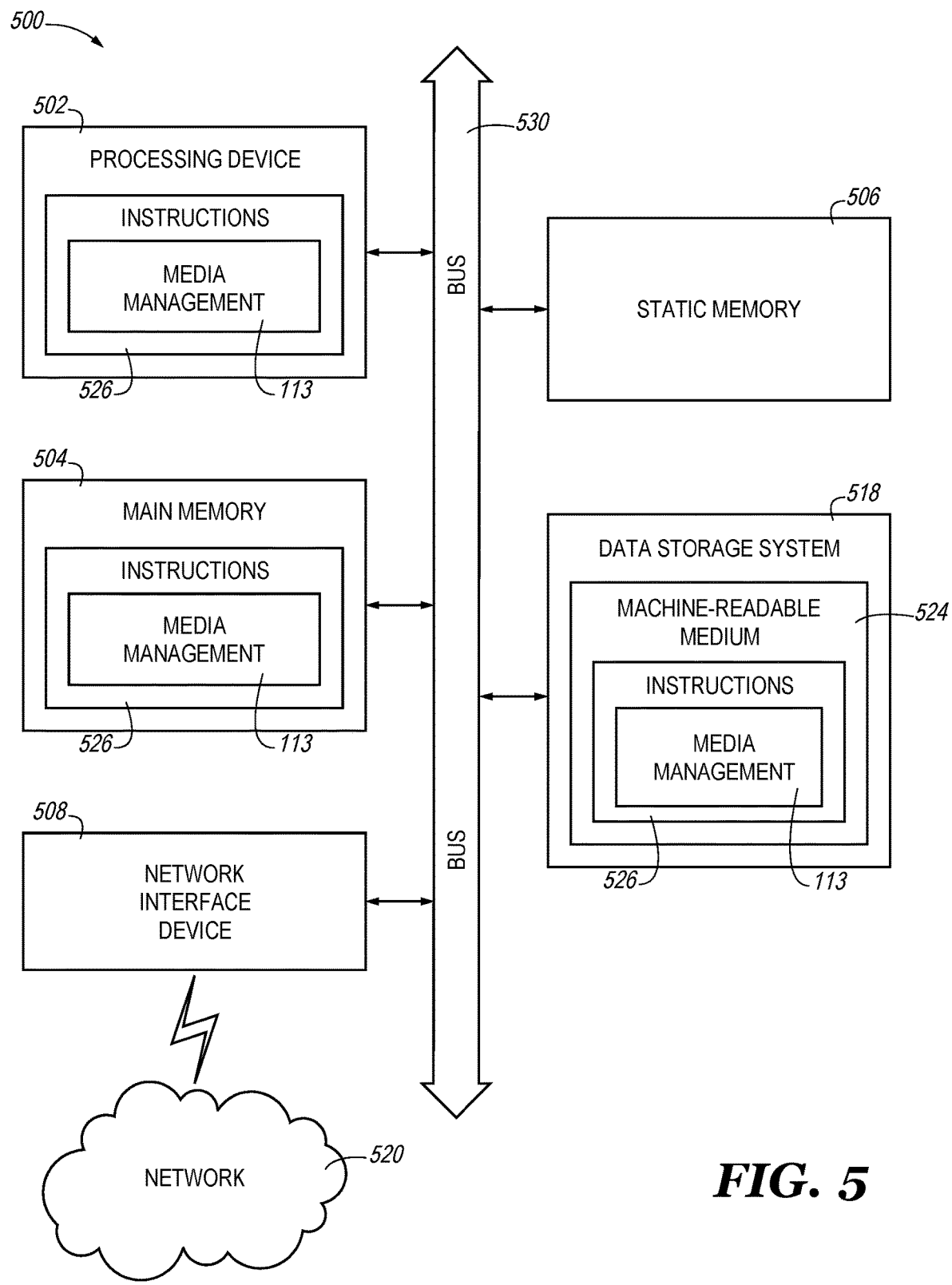
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a media management component (e.g., the media management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   determining a gap between:
     a difference in a minimum erase count (EC) and a maximum EC of blocks of memory cells; and
     a health threshold associated with the blocks of memory cells;
   determining the gap is greater than or equal to a gap threshold from the health threshold;
   performing a pseudo media management operation;
   subsequent to performing the pseudo media management operation, determining an updated minimum EC of the blocks of memory cells;
   determining an updated health threshold based on the health threshold, a value of an incremented erase counter, and a total memory cell block count;
   determining the gap between the updated minimum EC and an updated maximum EC is less than a gap threshold from the updated health threshold;
   determining the gap between the updated minimum EC and the updated maximum EC is greater than or equal to the gap threshold from the updated health threshold; and
   responsive to the determination that the gap is greater than or equal to the gap threshold from the updated health threshold, refraining from performing a media management operation.

2. The method of claim 1, comprising responsive to a determination that the gap is less than the gap threshold from the health threshold, performing a media management operation.

3. The method of claim 2, wherein performing the media management operation further comprises performing a wear-leveling operation.

4. The method of claim 3, wherein performing the wear-leveling operation further comprises performing a static-wear leveling operation.

5. The method of claim 1, further comprising performing the pseudo media management operation on the blocks of memory cells responsive to an occurrence of a memory operation.

6. The method of claim 5, wherein the memory operation is a an erase operation associated with the blocks of memory cells.

7. The method of claim 5, further comprising:
incrementing the maximum EC to an incremented maximum EC responsive to the occurrence of the memory operation;
determining an updated difference between the minimum EC and the incremented maximum EC;
determining an updated gap between the updated difference and the updated health threshold is less than the gap threshold from the updated health threshold;
responsive to determining the updated gap is less than the gap threshold from the health threshold, performing a wear-leveling operation on the blocks of memory cells.

8. An apparatus, comprising:
blocks of non-volatile memory cells; and
a memory sub-system media management component coupled to the blocks of non-volatile memory cells, wherein the memory sub-system media management component is configured to:
determine a minimum erase count (EC) and a maximum EC of the blocks of non-volatile memory cells;
determine a difference between the minimum EC and the maximum EC;
determine a gap between the difference and a health threshold is greater than a gap threshold from the health threshold;
perform a quantity of pseudo media management operations;
increment the maximum EC by an amount equal to the quantity of pseudo media management operations to an incremented maximum EC;
determine an updated difference between the minimum EC and the incremented maximum EC;
determine an updated gap between the updated difference and the health threshold is less than the gap threshold from the health threshold;
responsive to determination of the updated gap is less than the gap threshold from the health threshold, determine an updated minimum EC; and
determine an updated health threshold based on the health threshold, a value of an incremented erase counter, and a total memory cell block count.

9. The apparatus of claim 8, wherein the minimum EC corresponds to a lowest respective EC of the blocks of non-volatile memory cells.

10. The apparatus of claim 9, wherein the maximum EC corresponds to a highest respective EC of the blocks of non-volatile memory cells.

11. The apparatus of claim 8, wherein the memory sub-system media management component is configured to determine an updated minimum EC by performance of a media management operation.

12. The apparatus of claim 11, wherein the memory sub-system media management component is configured to perform the quantity of pseudo media management operations in the absence of performance of a wear-leveling operation.

13. The apparatus of claim 8, wherein the blocks of non-volatile memory cells further comprise blocks of NAND memory cells.

14. A system comprising:
a memory sub-system comprising a plurality of memory components arranged to form a stackable cross-gridded array of blocks of non-volatile memory cells; and
a processing device coupled to the plurality of memory components, the processing device to perform operations comprising:
responsive to an occurrence of an erase operation, determining a value of a difference between a minimum erase count (EC) and a maximum EC of the blocks of memory cells;
determining a gap between the difference and a health threshold is greater than a gap threshold from the health threshold;
performing a quantity of pseudo media management operations:
subsequent to performing the quantity of pseudo media operations, determining an updated difference between an updated minimum EC and an updated maximum EC;
determining an updated health threshold based the health threshold, a value of an incremented erase counter, and a total memory cell block count;
determining an updated gap between the updated difference and the updated health threshold is less than the gap threshold from the updated health threshold; and
responsive to determining the updated gap is less than the gap threshold from the updated health threshold, performing a wear-leveling operation on the blocks of non-volatile memory cells.

15. The system of claim 14, further comprising:
determining the difference between the minimum EC and the maximum EC at a first time; and
determining the updated difference at a second time that is subsequent to the first time.

16. The system of claim 14, further comprising performing the quantity of pseudo media management operations until it is determined that the updated difference is less than the gap threshold from the updated health threshold.

17. The system of claim 14, wherein the gap threshold is at least one health characteristic value less than the updated health threshold.

18. The system of claim 14, wherein the health threshold is equal to a quantity of EC, and wherein the gap threshold is at least one EC less than the quantity of EC.

* * * * *